United States Patent [19]

Taneya et al.

[11] Patent Number: 4,768,201
[45] Date of Patent: Aug. 30, 1988

[54] SEMICONDUCTOR LASER ARRAY

[75] Inventors: Mototaka Taneya, Sakai; Sadayoshi Matsui, Tenri; Seiki Yano, Kashihara; Saburo Yamamoto, Nara, all of Japan

[73] Assignee: Sharp Kabushiki Kaisha, Osaka, Japan

[21] Appl. No.: 760,538

[22] Filed: Jul. 30, 1985

[30] Foreign Application Priority Data

Aug. 6, 1984 [JP] Japan .................................. 59-164679
Mar. 29, 1985 [JP] Japan .................................. 60-67448

[51] Int. Cl.$^4$ .......................... H01S 3/19; H01S 3/098
[52] U.S. Cl. ......................................... 372/50; 372/18; 372/45; 372/48; 372/49; 372/97
[58] Field of Search ....................... 372/50, 18, 19, 20, 372/45, 48, 49, 97, 98, 108

[56] References Cited

U.S. PATENT DOCUMENTS 4,255,717 3/1981 Scifres et al. .......................... 372/50

Primary Examiner—William L. Sikes
Assistant Examiner—Georgia Y. Epps
Attorney, Agent, or Firm—Birch, Stewart, Kolasch & Birch

[57] ABSTRACT

A semiconductor laser array which includes a plurality of active wave guide in a substantially parallel manner disposed on first and second laser opposing laser facets so as to be optically coupled and so that adjacent wave guides converse into one or more active wave guides on an opposing laser facet. The laser array exhibits stable operations and a high output power in a single narrow beam. The active wave guides have identical vertical modes and a phase difference of zero degrees.

22 Claims, 2 Drawing Sheets

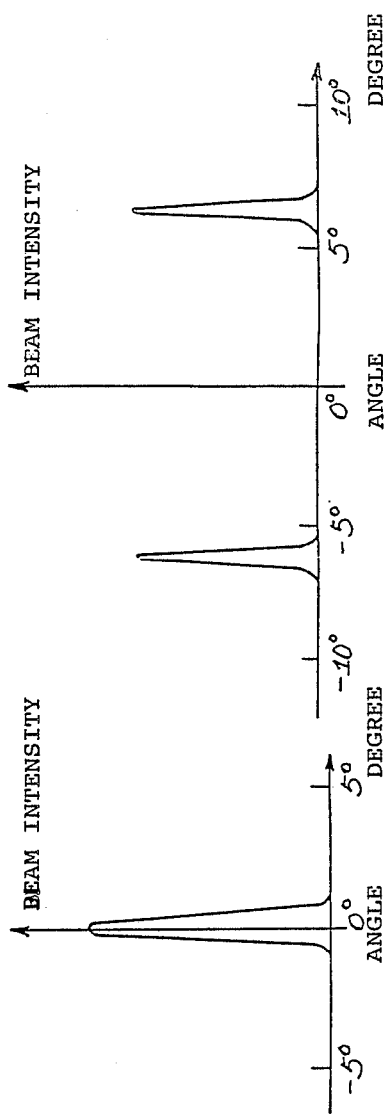

SEMICONDUCTOR LASER ARRAY

BACKGROUND OF THE INVENTION

The present invention relates to a semiconductor laser structure and, more particularly, to a semiconductor laser array which includes a plurality of active wave guides.

A semiconductor laser has been widely used as a light source in optical information processing systems such as an optical disc system a laser printer, and a medical apparatus.

However, the conventional semiconductor laser has merely a single active wave guide structure. Therefore, the maximum output of the laser in practice is about 60 to 70 mW.

Recently, to enhance the output level, a semiconductor laser having a plurality of active wave guides has been developed. The active wave guides are optically phase coupled to each other so as to emit the laser beam in a single phase. In other words, the laser beam from the adjacent two laser emitting regions is coupled so as to synchronize optical phases. This is referred to as the phase coupled laser array.

For example, W. Streifer et al of XEROX Corporation proposed a semiconductor laser array having ten active wave guides. (Appl. Phys. Letters, 42495 (1983)) The proposed laser array has, it has been reported, up to an output power of 200 mW, the device having a half value and full width less than 2 degrees in a far field pattern. In this laser structure, the beam output in the vertical mode from each of active wave guides are different from one another. Therefore, the beam phase from the active wave guides can not be synchronized with the other beam phases.

Another laser structure has a plurality of active wave guides in parallel in which the laser beams from the active wave guides are coupled by using a leak beam from each of the active wave guides. But, the above problem described in the first example still occurs. At the same time, in the above structure, the adjacent two active wave guides are coupled with polarizing action in crystallization like a wave guide type directional coupler. Therefore, the electric field has a phase difference of 180 degrees at the adjacent two active guides. The far field pattern has two peaks as shown in FIG. 4. In this situation, the optical system is not used to concentrate rays of light into a focus.

SUMMARY OF THE INVENTION

Accordingly, an object of the present invention is to provide a semiconductor laser array which exhibits stable operation and a high power output in a single narrow beam.

Another object of the present invention is to provide a semiconductor laser array having a plurality of active wave guides in which each of the active wave guides has a curved portion, wherein the vertical modes of all of the active wave guides are identical to each other with a phase difference of zero degrees.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above objects, according to an embodiment of the present invention, a semiconductor laser array is provided which includes a plurality of active wave guides having an index guide structure. Each of the active wave guides has a curved portion for connecting two adjacent active wave guides. The adjacent two active wave guides on one laser facet, are led to a single active wave guide on the opposing facet.

Further, the preferred embodiment of the present invention will be briefly described. A semiconductor layer array comprises a first wave guide disposed on a first laser facet, a second wave guide disposed parallel to the first wave guide on the first laser facet, a second third wave guide disposed on a laser facet opposed to the first laser facet, wherein the first and second wave guides converge into the third wave guide. The first and the second wave guides curve so as to converse into the third wave guide. A plurality of sets of first, second and third wave guides also provided.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 3 shows the far field pattern of the semiconductor laser array of FIGS. 1 and 2; and FIG. 4 shows the far field pattern of the conventional semiconductor laser array.

DETAILED DESCRIPTION OF THE PREFERRED EMBODIMENT

Figure 1:
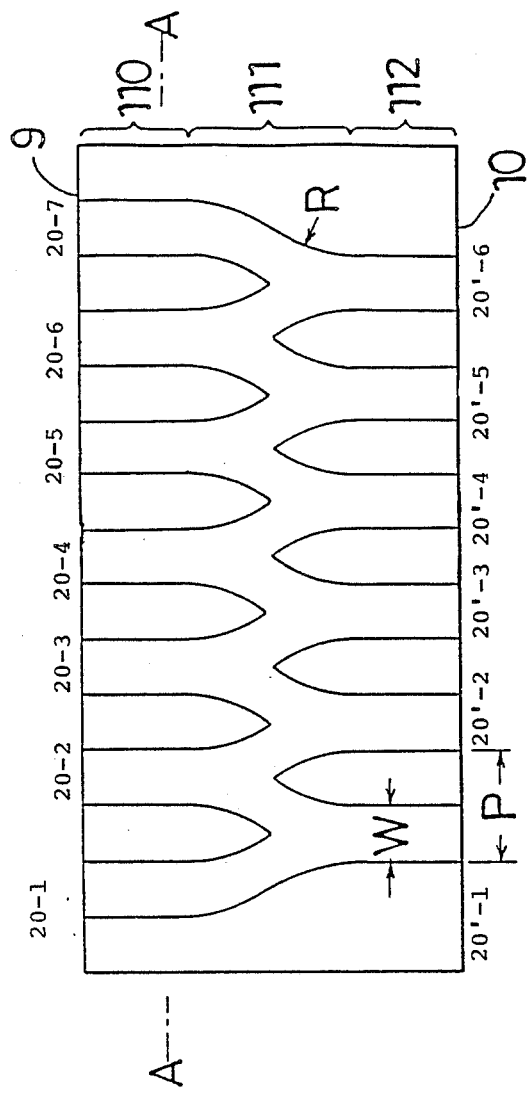
FIG. 1 shows a plan view of a semiconductor laser array according to an embodiment of the present invention.
Figure 2:
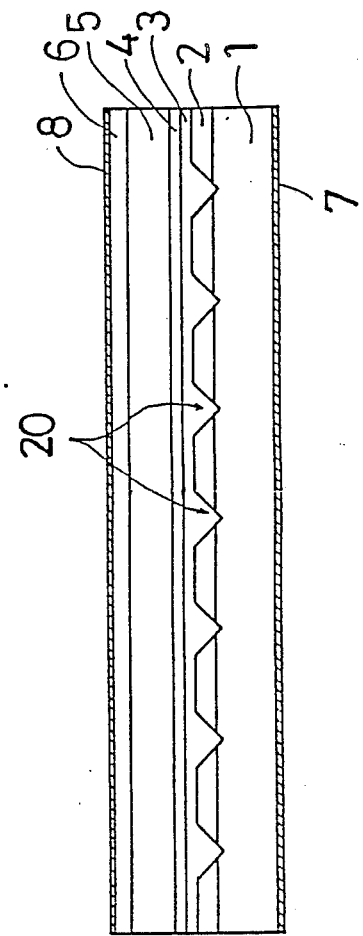
FIG. 2 shows a vertical view of a semiconductor laser array taken along a line A—A.

FIG. 1 shows a plan view of a semiconductor laser array according to a preferred embodiment of the present invention. FIG. 2 shows a sectional view of the semiconductor laser array of FIG. 1 taken along a line A—A. FIG. 3 shows the far field pattern of the semiconductor laser array of the present invention.

A semiconductor laser array of the present invention comprises a p-type GaAs substrate 1, a n-type GaAs layer 2, a p-type $Al_xGa(1-x)As$ cladding layer 3, a p- or n-type $AlyGa(1-y)As$ active layer 4, a n-type $Al_xGa(1-x)As$ cladding layer 5 and a $n^+$-type GaAs cap layer 6. The semiconductor laser array further includes a p-type ohmic electrode 7 and a n-type ohmic electrode 8.

The semiconductor laser array of a preferred embodiment of the present invention is provided as follows:

The n-type GaAs layer 2 is formed on the p-type GaAs substrate 1 by a crystal growth technique such as a liquid-phase epitaxial (LPE) growth method. A plurality of V-shaped channels 20 (20-1, 20-2, 20-3, ...) and 20' (20'-1, 20'-2, 20'-3, ...) are formed through the n-type GaAs layer 2 to the p-type GaAs substrate 1 by a photolithography method and an etching technique. On the p-type GaAs substrate 1 covered by the n-type GaAs layer 2 having the plurality of V-shaped channels 20 and 20', the p-type $Al_xGa(1-x)As$ cladding layer 3, the p- or n-type $AlyGa(1-y)As$ active layer 4, the n-type Al$_x$Ga(1−x)As cladding layer 5 and the n$^+$-type GaAs cap layer 6 are successively and sequentially grown by the liquid-phase epitaxial (LPE) growth method to form a multi-layered crystal of the double-heterojunction for laser diodes. (The AlAs molar fractions of the layers 3, 4 and 5 must satisfy x>y.) The p-type ohmic electrode 7 is formed on the rear surface of the p-type GaAs substrate 1. The n-type ohmic electrode 8 is formed on the surface of the grown crystal, which creates the ohmic contact to the n$^+$-type GaAs cup layer 6.

Finally, mirror facets 9 and 10 as the laser cavity facet are provided so as to form a cleavage plane.

The plurality of V-shaped channels 20 (20-1, 20-2, 20-3, . . . ) and 20' (20'-1, 20'-2, 20'-3, . . . ) function as active wave guides, respectively. On one laser facet (for example, on the mirror facet 9), two V-shaped channels 20-1 and 20-2 are adjacently provided in parallel, while on the opposing laser facet (for example, on the mirror facet 10), these two channels 20-1 and 20-2 are led to a single wave guide 20'-1.

On the contrary, while two adjacent V-shaped channels 20'-1 and 20'-2 are provided on the mirror facet 10, a common single V-shaped channel 20-1 as the active wave guide is provided on the mirror facet 9 for these two V-shaped channels 20'-1 and 20'-2. Thus, the V-shaped channels 20 (20-1, 20-2, 20-3, . . . ) on the mirror facet 9 and the V-shaped channels 20' (20'-1, 20'-2, 20'-3, . . . ) on the mirror facet 10 are alternatively shifted with a half pitch, respectively.

The V-shaped channels 20 on the mirror facet 9 and the V-shaped channels 20' on the mirror facet 10, which are shifted with a half pitch, are connected to each other by using a curved channel in the middle of the laser cavity.

The curved active guide area 111 is provided between the areas 110 and 112. In the areas 110 and 112, the plurality of V-shaped straight channels 20 and 20' are formed in parallel, and the adjacent two V-shaped channels are symmetrically provided. A radius of curvature of the curved active wave guide at the curved active wave guide area 111 is equal to or more than about 200 μm. This value is the minimum radius of curvature necessary to confine the beams well within the curved active wave guide. If the radius of curvature is less than about 200 μm, the beam is not reflected perfectly at the interface between the wave guides, and further, the beam may be radiated to the outside of the wave guides.

The V-shaped channels 20 and 20' on the mirror facets 9 and 10, which are deviated with the half pitch, are connected to each other to form a curved wave guide structure in the middle of the mirror facets 9 and 10.

Since the V-shaped channels 20 and 20' have curved channel portions, respectively, the adjacent two active wave guides at the areas 110 and 112 in FIG. 2 are connected to form the single active guide on the opposing laser facet.

In the embodiment of the present invention, when a first set of the wave guides includes the first, the second and the third wave guides 20-1, 20-2 and 20'-1, the substantial portion of the second wave guide 20-2 of the first set of the three wave guides is also a substantial portion of the first wave guide 20-2 of the adjacent set of the three wave guides 20-2, 20-3, 20'-2. The first and second wave guides 20-1 and 20-2 are symmetrically provided across the center line between the first and second active wave guides 20-1 and 20-2. The third wave guide 20'-1 on the opposing laser face commonly connected to the first and second wave guides 20-1 and 20-2 is symmetrically provided across the center line between the first and second wave guides 20-1 and 20-2. Substantial portions these first and the second wave guides 20-1 and 20-2 are formed straight in parallel for optically coupling of the two wave guides.

One example of the semiconductor laser array of the present invention is as follows:

The width W of the channel 20 and 20' is about 4 μm. The pitch P of the active wave guides is about 8 μm. If desired, the width W may be less than 4 μm, and the pitch P may be less than about 8 μm. This reason is that the adjacent two active wave guides are optically coupling to each other on the areas 110 and 112. The length of the areas 110 and 112 is about 110 μm. The length of the curved wave guide area 111 is about 70 μm. The radius R of curvature of the curved wave guide at the curved wave guide area 111 is about 300 μm. The radius of curvature should be determined to ensure that the beam is well-confined in the curved active wave guide.

As described above, in the present invention, the adjacent two active wave guides such as the adjacent two V-shaped channels are connected to each other to form the single wave guide at a suitable portion, so that the 180 degrees phase shift modes are cancelled to each other. On the contrary, the zero degree phase shift modes are strengthened even at the connection area. In the embodiment of the present invention, the threshold gain of the zero degree phase shift mode is minimum, and the 180 degrees phase shift mode is actually suppressed. In this case, a single zero degree phase shift mode oscillation can be obtained. A single lobed far field pattern having a smaller half value width is shown in FIG. 3.

The main characteristices of the embodiment of the present invention is as follows:

Threshold current: about 200 mA.

Maximum zero degree phase mode output: 350 mW.

As described above, the semiconductor laser array has the plurality of active wave guides. The adjacent two active wave guides on one laser facet are connected to each other and lead to a single active guide on the opposing laser facet by using a curved wave guide portion. On one laser facet, the adjacent active wave guides are provided, but on the opposing laser facet, the adjacent two wave guides on one laser facet are connected to each other and lead to a single active wave guide. The adjacent two active wave guides are symmetrially provided on one laser facet. Therefore, the vertical modes of the all active wave guides becomes single. The phase of each of all of the active wave guides is synchronized.

The adjacent active wave guides which are symmetrically provided, are connected to each other so that a single wave guide is provided on the opposing laser facet. The single wave guide is symmetrically provided. Across the line at the center of the single wave guide on the opposing laser facet, the two adjacent active wave guides on one laser facet are symmetrically disposed. Therefore, the transverse modes of the all active wave guides are identically single and the phase of the all active wave guides are synchronized with each other. Therefore, the stabilized zero degree phase shift mode can be obtained even in the high output power region.

In the present invention, the cladding layer 3 may completely fill the V-shaped channels 20 and 20' to a flat top and the active layer 4 may be flat without the curviture. The semiconductor layer used to form the active wave guide so as to confine the laser beam may be substantially flat over the light emitting area of the laser array.

The active wave guides may be formed in an index guide structure.

In the connections of the active wave guides, the wave guides are formed in the shape of "Y".

The invention being thus described, it will be obvious that the same may be varied in many ways. Such variations are not to be regarded as a departure from the spirit and scope of the invention, and all such modifications are intended to be included within the scope of the following claims.

What is claimed is:

1. A semiconductor laser array comprising:
   a laser structure having oppositely disposed first and second facets which includes,
   a substrate,
   a channel layer formed on said substrate, wherein said channel layer has a plurality of channels formed therein so as to penetrate into said substrate,
   a first cladding layer formed on said channel layer,
   an active layer formed on said first cladding layer,
   a second cladding layer formed on said active layer, and
   a cap layer formed on said second cladding layer, said semiconductor laser array further comprising,
   a first active wave guide corresponding to one of said channels disposed at said first facet;
   a second active wave guide corresponding to one of said channels disposed at said first facet substantially parallel to said first active wave guide; and
   a third active wave guide corresponding to one of said channels disposed at said second facet,
   wherein said first and second active wave guides converge into said third active wave guide and wherein said active wave guides have identical vertical modes and a phase difference of zero degrees.

2. The semiconductor laser array of claim 1, wherein said laser array comprises a plurality of sets of said first, second and third active wave guides.

3. The semiconductor laser array of claim 2, wherein said laser array comprises a plurality of active wave guides, wherein adjacent active wave guides disposed at said first facet converge into active wave guides disposed at said second facet, and wherein adjacent active wave guides disposed at said second facet converge into said active wave guides disposed at said first facet.

4. The semiconductor laser array of claim 1, wherein said active layer is for confining a laser beam and is flat over the light emitting area of said semiconductor laser array.

5. The semiconductor laser array of claim 1, wherein said third active wave guide is provided on said second facet along a symmetrical center line between said first and second active wave guides.

6. The semiconductor laser array of claim 1, wherein substantial portions of said first and second active wave guides are straight and parallel so as to optically connect said first and second active wave guides.

7. The semiconductor laser array of claim 1, wherein said first and second active wave guides curve at respective curved portions to converge into said third active wave guide.

8. A semiconductor laser array comprising:
   a p-type GaAs substrate;
   an n-type GaAs channel layer formed on said substrate, said channel layer having formed therein first, second, and third V-shaped channels which penetrate into said substrate and which correspond to first, second, and third active wave guides, wherein said first active wave guide is formed adjacent to said second active wave guide disposed at a first facet and wherein said first and second active wave guides converge into said third active wave guide disposed at a second facet, said second facet being disposed opposite said first facet;
   a p-type $Al_xGa_{1-x}As$ first cladding layer formed on said channel layer;
   a p- or n-type $Al_yGa_{1-y}As$ active layer formed on said first cladding layer;
   an n-type $Al_xGa_{1-x}As$ second cladding layer formed on said active layer;
   an $n^+$-type GaAs cap layer formed on said second cladding layer;
   a p-type ohmic electrode formed on said substrate, and
   an n-type ohmic electrode formed on said cap layer, wherein said active wave guides have identical vertical modes and a phase difference of zero degrees.

9. The semiconductor laser array of claim 8, wherein the AlAs molar fraction satisfies the following condition: $x > y$.

10. The semiconductor laser array of claim 8, wherein said first and second active wave guides curve at respective curved portions to converge into said third active wave guide.

11. The semiconductor laser array of claim 8, wherein said laser array comprises a plurality of sets of said first, second and third active wave guides.

12. The semiconductor laser array of claim 8, wherein said laser array comprises a plurality of active wave guides, wherein adjacent active wave guides disposed at said first facet converge into active wave guides disposed at said second facet, and wherein adjacent active wave guides disposed at said second facet converge into said active wave guides disposed at said first facet.

13. The semiconductor laser array of claim 8, wherein substantial portions of said first and second active wave guides are straight and parallel so as to optically connect said first and second active wave guides.

14. The semiconductor laser array of claim 10, wherein the radius of curvature of said curved portions of said first and second active wave guides is equal to or more than about 300 $\mu m$.

15. The semiconductor laser array of claim 8, wherein the width of said V-shaped channels are equal to or less than about 4 $\mu m$.

16. The semiconductor laser array of claim 8, wherein the distance between said first and second active wave guides is equal to or less than about 8 $\mu m$.

17. The semiconductor laser array of claim 8, wherein said active layer is substantially flat.

18. The semiconductor laser array of claim 8, wherein said first, second and third active wave guides are alternatively positioned with a half pitch.

19. The semiconductor laser array of claim 12, wherein said active wave guides are substantially straight and parallel before curving at curved portions to converge with said adjacent active wave guides.

20. The semiconductor laser array of claim 19, wherein the radius of curvature of said curved portions of said active wave guides is equal to or more than about 200 μm.

21. A semiconductor laser array comprising:
a substrate;
a channel layer formed on said substrate, said channel layer and said substrate having a plurality of channels formed therein which act as active wave guides, wherein adjacent active wave guides disposed at a first facet converge into active wave guides disposed at said second facet and wherein adjacent active wave guides disposed at said second facet converge into said active wave guides disposed at said first facet;
a first cladding layer formed on said channel layer;
an active layer formed on said first cladding layer;
a second cladding layer formed on said active layer;
a cap layer formed on said second cladding layer;
a first electrode formed on said substrate; and
a second electrode formed on said cap layer;
wherein said active wave guides have identical vertical modes and a phase difference of zero degrees.

22. The semiconductor laser array of claim 7, wherein the radius of curvature of said curved portions of said first and second active wave guides is equal to or more than about 200 μm.

* * * * *